(12) United States Patent
Matsui et al.

(10) Patent No.: US 7,564,889 B2
(45) Date of Patent: Jul. 21, 2009

(54) ADIABATICALLY FREQUENCY MODULATED SOURCE

(75) Inventors: Yasuhiro Matsui, Lawrence, MA (US); Daniel Mahgerefteh, Los Angeles, CA (US)

(73) Assignee: Finisar Corporation, Sunnyvale, CA (US)

(*) Notice: Subject to any disclaimer, the term of this patent is extended or adjusted under 35 U.S.C. 154(b) by 121 days.

(21) Appl. No.: 11/051,893

(22) Filed: Feb. 4, 2005

(65) Prior Publication Data

US 2006/0018666 A1 Jan. 26, 2006

Related U.S. Application Data

(63) Continuation-in-part of application No. 11/037,893, filed on Jan. 18, 2005, now Pat. No. 7,187,821, and a continuation-in-part of application No. 10/680,607, filed on Oct. 6, 2003, now Pat. No. 7,054,538, and a continuation-in-part of application No. 10/308,522, filed on Dec. 3, 2002, and a continuation-in-part of application No. 10/289,944, filed on Nov. 6, 2002, now Pat. No. 6,963,685.

(60) Provisional application No. 60/541,816, filed on Feb. 4, 2004.

(51) Int. Cl.
*H01S 5/00* (2006.01)
*H01S 3/08* (2006.01)
*H01B 10/04* (2006.01)
*H01B 10/12* (2006.01)

(52) U.S. Cl. ........... 372/96; 372/50.11; 372/102; 398/183

(58) Field of Classification Search ........ 372/50.11, 372/96, 102; 398/183
See application file for complete search history.

(56) References Cited

U.S. PATENT DOCUMENTS

| 3,324,295 | A |   | 6/1967  | Harris         |         |
|-----------|---|---|---------|----------------|---------|
| 3,999,105 | A |   | 12/1976 | Archey et al.  |         |
| 4,038,600 | A |   | 7/1977  | Thomas et al.  |         |
| 4,561,119 | A |   | 12/1985 | Epworth        |         |
| 4,805,235 | A |   | 2/1989  | Henmi          |         |
| 4,841,519 | A |   | 6/1989  | Nishio         |         |
| 4,896,325 | A | * | 1/1990  | Coldren ...... | 372/20  |
| 5,088,097 | A | * | 2/1992  | Ono et al. ... | 372/20  |
| 5,119,393 | A | * | 6/1992  | Oka et al. ... | 372/50.22 |

(Continued)

FOREIGN PATENT DOCUMENTS

GB    2107147 A    4/1983

(Continued)

OTHER PUBLICATIONS

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

(Continued)

*Primary Examiner*—Kenneth A Parker
*Assistant Examiner*—Hrayr A. Sayadian
(74) *Attorney, Agent, or Firm*—Workman Nydegger

(57) ABSTRACT

A Distributed Feed-Back (DFB) laser integrated with an Electroabsorption (EA) modulator whose facet at the end of EA modulator section has finite reflectivity to create adiabatic chirp by optical feedback to the DFB laser.

19 Claims, 8 Drawing Sheets

U.S. PATENT DOCUMENTS

| | | | |
|---|---|---|---|
| 5,293,545 A | 3/1994 | Huber | |
| 5,325,378 A | 6/1994 | Zorabedian | |
| 5,325,382 A * | 6/1994 | Emura et al. | 372/26 |
| 5,371,625 A | 12/1994 | Wedding et al. | |
| 5,412,474 A | 5/1995 | Reasenberg et al. | |
| 5,416,629 A | 5/1995 | Huber | |
| 5,434,693 A * | 7/1995 | Tanaka et al. | 398/192 |
| 5,450,432 A * | 9/1995 | Okuda | 372/50.11 |
| 5,465,264 A | 11/1995 | Buhler et al. | |
| 5,477,368 A | 12/1995 | Eskildsen et al. | |
| 5,550,667 A | 8/1996 | Krimmel et al. | |
| 5,568,311 A * | 10/1996 | Matsumoto | 359/344 |
| 5,592,327 A | 1/1997 | Gabl et al. | |
| 5,737,104 A | 4/1998 | Lee et al. | |
| 5,777,773 A | 7/1998 | Epworth et al. | |
| 5,805,235 A | 9/1998 | Bedard | |
| 5,856,980 A | 1/1999 | Doyle et al. | |
| 5,920,416 A | 7/1999 | Beylat et al. | |
| 5,953,139 A | 9/1999 | Nemecek et al. | |
| 5,953,361 A * | 9/1999 | Borchert et al. | 372/96 |
| 5,974,209 A | 10/1999 | Cho et al. | |
| 6,081,361 A | 6/2000 | Adams et al. | |
| 6,088,373 A * | 7/2000 | Hakki | 372/20 |
| 6,096,496 A | 8/2000 | Frankel | |
| 6,104,851 A | 8/2000 | Mahgerefteh | |
| 6,115,403 A | 9/2000 | Brenner et al. | |
| 6,222,861 B1 | 4/2001 | Kuo et al. | |
| 6,271,959 B1 | 8/2001 | Kim et al. | |
| 6,298,186 B1 | 10/2001 | He | |
| 6,331,991 B1 | 12/2001 | Mahgerefteh | |
| 6,359,716 B1 | 3/2002 | Taylor | |
| 6,459,518 B1 * | 10/2002 | Suzuki et al. | 398/152 |
| 6,473,214 B1 | 10/2002 | Roberts et al. | |
| 6,506,342 B1 | 1/2003 | Frankel | |
| 6,563,623 B1 | 5/2003 | Penninckx et al. | |
| 6,577,013 B1 | 6/2003 | Glenn et al. | |
| 6,580,739 B1 * | 6/2003 | Coldren | 372/50.21 |
| 6,618,513 B2 | 9/2003 | Evankow, Jr. | |
| 6,628,690 B1 * | 9/2003 | Fish et al. | 372/50.1 |
| 6,654,564 B1 | 11/2003 | Colbourne et al. | |
| 6,665,351 B2 | 12/2003 | Hedberg | |
| 6,687,278 B1 | 2/2004 | Mason et al. | |
| 6,738,398 B2 * | 5/2004 | Hirata et al. | 372/32 |
| 6,748,133 B2 | 6/2004 | Liu et al. | |
| 6,778,307 B2 | 8/2004 | Clark | |
| 6,810,047 B2 | 10/2004 | Oh et al. | |
| 6,834,134 B2 | 12/2004 | Brennan et al. | |
| 6,836,487 B1 | 12/2004 | Farmer et al. | |
| 6,847,758 B1 | 1/2005 | Watanabe | |
| 6,947,206 B2 | 9/2005 | Tsadka et al. | |
| 6,963,685 B2 * | 11/2005 | Mahgerefteh et al. | 385/37 |
| 7,013,090 B2 | 3/2006 | Adachi et al. | |
| 7,054,538 B2 | 5/2006 | Mahgerefteh et al. | |
| 7,076,170 B2 | 7/2006 | Choa | |
| 7,123,846 B2 | 10/2006 | Tateyama et al. | |
| 7,263,291 B2 | 8/2007 | Mahgerefteh et al. | |
| 7,280,721 B2 | 10/2007 | McCallion et al. | |
| 2001/0048705 A1* | 12/2001 | Kitaoka et al. | 372/43 |
| 2002/0048290 A1* | 4/2002 | Tanaka | 372/25 |
| 2002/0154372 A1 | 10/2002 | Chung et al. | |
| 2002/0159490 A1 | 10/2002 | Karwacki | |
| 2002/0176659 A1 | 11/2002 | Lei et al. | |
| 2003/0002120 A1 | 1/2003 | Choa | |
| 2003/0063647 A1* | 4/2003 | Yoshida et al. | 372/50 |
| 2003/0067952 A1 | 4/2003 | Tsukiji et al. | |
| 2003/0099018 A1 | 5/2003 | Singh et al. | |
| 2003/0147114 A1* | 8/2003 | Kang et al. | 359/245 |
| 2003/0161370 A1* | 8/2003 | Buimovich et al. | 372/50 |
| 2003/0169787 A1* | 9/2003 | Vurgaftman et al. | 372/20 |
| 2003/0193974 A1 | 10/2003 | Frankel et al. | |
| 2004/0008933 A1 | 1/2004 | Mahgerefteh et al. | |
| 2004/0008937 A1* | 1/2004 | Mahgerefteh et al. | 385/37 |
| 2004/0036943 A1 | 2/2004 | Freund et al. | |
| 2004/0076199 A1* | 4/2004 | Wipiejewski et al. | 372/26 |
| 2004/0096221 A1 | 5/2004 | Mahgerefteh et al. | |
| 2004/0218890 A1 | 11/2004 | Mahgerefteh et al. | |
| 2005/0100345 A1 | 5/2005 | Welch et al. | |
| 2005/0111852 A1 | 5/2005 | Mahgerefteh et al. | |
| 2005/0175356 A1 | 8/2005 | McCallion et al. | |
| 2005/0206989 A1 | 9/2005 | Marsh | |
| 2005/0213993 A1* | 9/2005 | Kazemi-Nia et al. | 398/198 |
| 2005/0271394 A1 | 12/2005 | Whiteaway et al. | |
| 2005/0286829 A1 | 12/2005 | Mahgerefteh et al. | |
| 2006/0002718 A1 | 1/2006 | Matsui et al. | |
| 2006/0029358 A1 | 2/2006 | Mahgerefteh et al. | |
| 2006/0029396 A1 | 2/2006 | Mahgerefteh et al. | |
| 2006/0029397 A1 | 2/2006 | Mahgerefteh et al. | |
| 2006/0120416 A1* | 6/2006 | Hu et al. | 372/26 |
| 2006/0228120 A9 | 10/2006 | McCallion et al. | |
| 2006/0233556 A1 | 10/2006 | Mahgerefteh et al. | |
| 2006/0239306 A1* | 10/2006 | Donohoe et al. | 372/20 |
| 2006/0274993 A1 | 12/2006 | Mahgerefteh et al. | |
| 2008/0037608 A1* | 2/2008 | Zhou et al. | 372/50.11 |

FOREIGN PATENT DOCUMENTS

| | | |
|---|---|---|
| WO | 9905804 | 2/1999 |
| WO | 0104999 | 1/2001 |
| WO | 03005512 | 7/2002 |

OTHER PUBLICATIONS

Corvini, P.J. et al., Computer Simulation of High-Bit-Rate Optical Fiber Transmission Using Single-Frequency Lasers, Journal of Lightwave Technology, Nov. 1987, 1591-1595, vol. LT-5, No. 11.

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Alexander et al., Passive Equalization of Semiconductor Diode Laser Frequency Modulation, Journal of Lightwave Technology, Jan. 1989, 11-23, vol. 7, No. 1.

Hyryniewicz, J.V., et al., Higher Order Filter Response in Coupled Microring Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutali et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3-µm InGaAl As Multiquantum Well Ridge Waveguide Distributed Feedback Lasers, IEEE Photonics Technology Leters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

\* cited by examiner

Figure 2. Integrated DFB/EA with phase section adiabatically frequency modulated Figure 3. Adiabatic chirp depends on facet reflectivity.

Figure 4 Adiabatic chirp as a function of delay time for the feedback from the EA facet.

Figure 5 Simulated adabatic chirp for cases of varied grating phases from -150 deg to -30 deg.

(a) Chirp as a function of injection current into DFB section 2 ranged from 50 mA to 260 mA with 30 mA step (from bottom to top) (Fig. 6)

(b) corresponding intensity waveform (Fig. 7)

ADIABATICALLY FREQUENCY MODULATED SOURCE

REFERENCE TO PENDING PRIOR PATENT APPLICATIONS

This patent application is:

(i) a continuation-in-part of U.S. patent application Ser. No. 10/289,944, filed Nov. 06, 2002 now U.S. Pat. No. 6,963,685 by Daniel Mahgerefteh et al. for POWER SOURCE FOR A DISPERSION COMPENSATION FIBER OPTIC SYSTEM;

(ii) a continuation-in-part of U.S. patent application Ser. No. 10/308,522, filed Dec. 03, 2002 by Daniel Mahgerefteh et al. for HIGH-SPEED TRANSMISSION SYSTEM COMPRISING A COUPLED MULTI-CAVITY OPTICAL DISCRIMINATOR;

(iii) a continuation-in-part of U.S. patent application Ser. No. 10/680,607, filed Oct. 06, 2003 now U.S. Pat. No. 7,054,538 by Daniel Mahgerefteh et al. for FLAT DISPERSION FREQUENCY DISCRIMINATOR (FDFD);

(iv) a continuation-in-part of U.S. patent application Ser. No. 11/037,607, filed Jan. 18, 2005 now U.S. Pat. No. 7,187,821 by Yasuhiro Matsui et al. for CARRIER SUPPRESSION USING ADIABATIC FREQUENCY MODULATION (AFM); and (v) claims benefit of U.S. Provisional Patent Application Ser. No. 60/541,816, filed Feb. 04, 2004 by Yasuhiro Matsui for AN ADIABATICALLY FREQUENCY MODULATED SOURCE.

The five above-identified patent applications are hereby incorporated herein by reference.

FIELD OF THE INVENTION

This invention relates to signal transmissions in general, and more particularly to the transmission of optical signals signals.

BACKGROUND OF THE INVENTION

The quality and performance of a digital fiber optic transmitter is determined by the distance over which its signal can propagate without severe distortions. The Bit Error Rate (BER) of the signal is measured at a receiver after propagation through dispersive fiber, and then the optical power required to obtain a certain BER (typically $10^{-12}$), sometimes called the sensitivity, is determined.

The difference in sensitivity between (i) at the output of the transmitter and (ii) the sensitivity after propagation through a fiber is sometimes called the dispersion penalty. This sensitivity difference is typically characterized with respect to distance over which a dispersion penalty reaches ~1 dB. A standard 10 Gb/s optical digital transmitter, such as an externally modulated source, can transmit up to a distance of ~50 km in standard single mode fiber, at 1550 nm, before it reaches the dispersion penalty of ~1 dB; this distance is sometimes called the dispersion limit. This particular limit is determined by the fundamental assumption that the signal is transform limited, i.e., has no time varying phase across its bits and has a bit period of 100 ps, or 1/bit rate.

Another measure of the quality of a transmitter is the absolute sensitivity after fiber propagation.

Systems for long-reach lightwave data transmission through optical fibers are disclosed in: (i) U.S. patent application Ser. No. 10/289,944, filed Nov. 6, 2002 by Daniel Mahgerefteh et al. for POWER SOURCE FOR A DISPERSION COMPENSATION FIBER OPTIC SYSTEM; (ii) U.S. patent application Ser. No. 10/680,607, filed Oct. 06, 2003, by Daniel Mahgerefteh et al. for FLAT DISPERSION FREQUENCY DISCRIMINATOR (FDFD); and (iii) U.S. patent application Ser. No. 10/308,522, filed Dec. 03, 2002 by Daniel Mahgerefteh et al. for HIGH-SPEED TRANSMISSION SYSTEM COMPRISING A COUPLED MULTI-CAVITY OPTICAL DISCRIMINATOR; which patent applications are hereby incorporated herein by reference. The transmitter associated with these novel systems is sometimes referred to as a Chirp Managed Laser (CML™) by Azna LLC of Wilmington, Mass.

In these new systems, an Adiabatically Frequency Modulated (AFM) source is followed by an Optical Spectrum Reshaper (OSR) which uses the frequency modulation to increase the amplitude modulated signal and partially compensates for the dispersion in the transmission fiber. An Optical Spectrum Reshaper (OSR), sometimes referred to as a frequency discriminator, can be formed by an appropriate optical element that has a wavelength-dependent transmission function. The OSR can be adapted to convert frequency modulation to amplitude modulation. Importantly, the OSR can also be adapted to convert amplitude modulation to frequency modulation.

The optical signal generated by a CML™ has an important property, i.e., that the optical carrier frequency is modulated to have the same profile in time as the information carrying amplitude modulation, albeit with a phase delay. This signal is sometimes referred to as an adiabatically chirped amplitude modulated signal in U.S. patent application Ser. No. 11/037,893 filed Jan. 18, 2005 by Yasuhiro Matsui et al. for CARRIER SUPPRESSION USING ADIABATIC FREQUENCY MODULATION (AFM), which patent application is hereby incorporated herein by reference. As is disclosed this patent application, this concomitant amplitude and frequency modulation increases the tolerance of the signal to fiber dispersion, i.e., an AFM signal can propagate a longer distance in a dispersive fiber before it is distorted and its Bit Error Rate (BER) is substantially reduced.

In one embodiment of the CML™ system, described in U.S. patent application Ser. No. 10/289,944, which patent application is hereby incorporated herein by reference, frequency modulation and amplitude modulation is achieved by modulating the bias current of an FM source, such as a Distributed Feed-Back (DFB) laser, with digital data. The resulting amplitude modulation is further enhanced by an Optical Spectrum Reshaper (OSR), sometimes also referred to as a frequency discriminator, placed after the DFB. Further improvements of the CML™ system are described in U.S. patent application Ser. No. 10/680,607 and in U.S. patent application Ser. No. 10/308,522, which two patent applications are hereby incorporated herein by reference.

BRIEF DESCRIPTION OF THE FIGS.

DESCRIPTION OF THE INVENTION

In this patent application, there is now disclosed another novel embodiment of an AFM transmitter, comprising an integrated Distributed Feed-Back (DFB) laser and electroabsorption (EA) modulator with a phase section.

Figure 1:
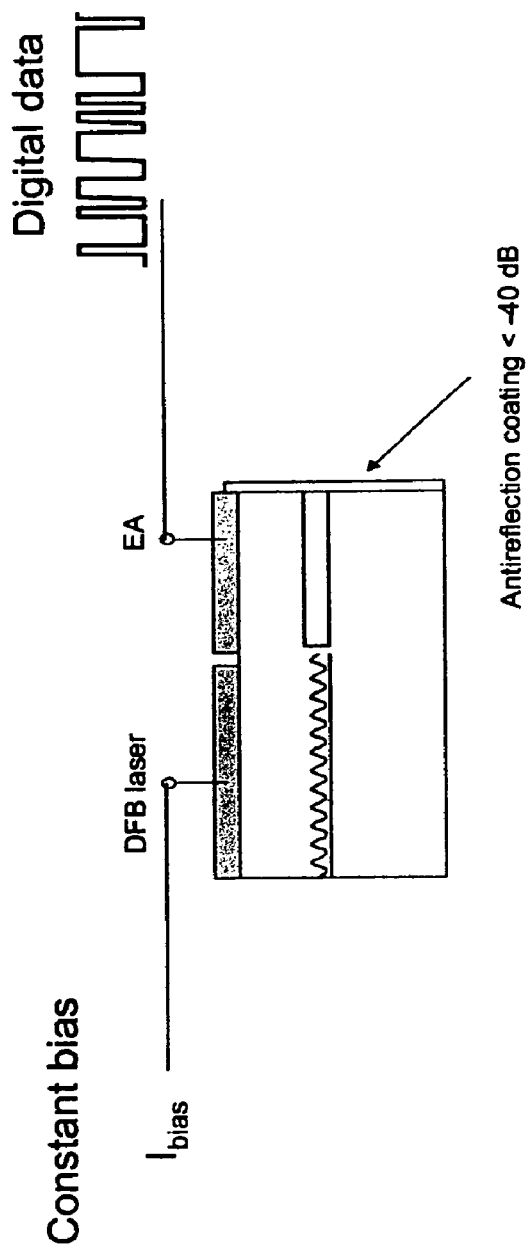
FIG. 1 is a side view of a laser in accordance with the prior art.

Integrated laser-electroabsorption modulators are commonly used in industry as high speed optical digital transmitters in fiber optic systems. They consist of a monolithically integrated DFB laser and an electroabsorption (EA) modulator, as shown in FIG. 1. In its common usage, the DFB section is biased with a constant bias current to provide a relatively high optical power, at a constant optical carrier frequency, to the electroabsorption (EA) modulator section. The electrical digital data, in the form of a voltage, is applied to the EA section. The applied voltage modulates the absorption of the EA section and acts as a gate; the intensity of the output of the DFB laser is modulated, replicating the input digital data. The EA section adds some transient chirp to the output signal, since the refractive index of the EA section varies with time due to the Kramers-Kronig relation. In these prior art uses of these integrated laser-electroabsorption modulators, it is important to ensure that there is no reflection from the end facet of the device. This is achieved by applying an anti-reflective coating at the end facet. A reflectivity of –40 dB is typical for these prior art applications. This is because reflection from the end facet sends the modulated light back into the DFB, causing unwanted chirp, which can affect the transmission distance of the output.

A basic idea of the present invention is that when the EA section is electrically modulated, part of the modulated light can reflect from the front facet and go back into the DFB laser, which is biased above threshold and is providing CW optical power. The bias of the laser is constant. In the absence of reflections from the front facet, the DFB provides a CW signal without chirp. The EA section is, ideally, an amplitude modulator based on the quantum confined stark effect. Application of a voltage shifts the excitation peak and changes the absorption, therefore leading to modulation of the amplitude of the incident field. However, with the absorption change, there is an accompanying phase change, as expected from Kramers-Kronig relation. The phase modulation produces a transient frequency modulation at the transition of the 1 bits-to-0 bits (and 0 bits-to-1 bits) in a digital modulation example. The transient chirp may help reduce dispersion tolerance, or increase it, depending on the sign of this chirp. Adjusting the bias voltage of the EA can change the sign of the transient chirp. When the modulated back reflections enter the DFB section, they modulate the gain of the laser slightly and lead to an adiabatic chirp through the linewidth enhancement effect.

In prior art techniques, such adiabatic chirp has been considered to be detrimental to fiber transmission and, therefore, applying very high-quality AR coating has been used to reduce undesired back reflection. In some cases, elaborating window structures have been used to reduce the reflection where the waveguide is terminated before the beam reaches the end facet and thus spatially disperses reflected light traveling back to the active section.

In the above-identified patent applications, the advantages of the ASK-FSK modulation format, where the adiabatic chirp from the transmitter improves the transmission performances, are discussed. In these systems, the control of amount of adiabatic chirp is an important aspect in order to apply the above-mentioned EML laser for CML™ frequency modulation, as described in U.S. patent application Ser. No. 10/289,944.

Figure 2:
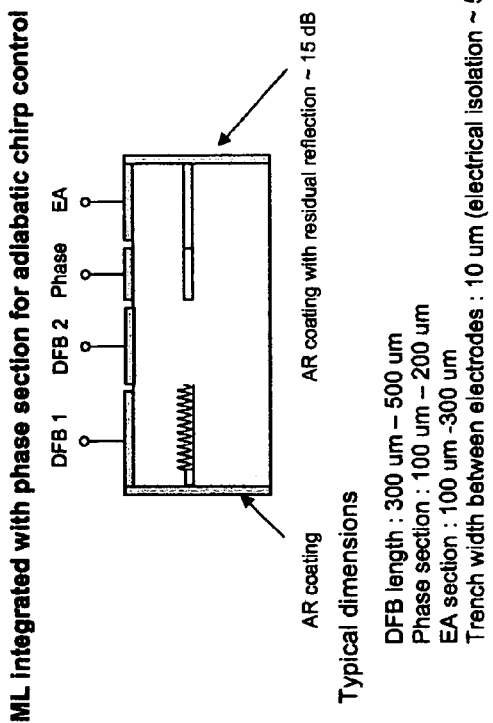
FIG. 2 is a side view of a laser including integrated distributed feedback, electroabsorption, and phase sections in accordance with an embodiment of the present invention.

In a preferred embodiment of the present invention, and looking now at FIG. 2, there is disclosed a system and method for controlling the adiabatic chirp in an integrated DFB and EA device, such that it can be used in a system of the type disclosed in U.S. patent application Ser. No. 10/289,944.

In the present invention, the integrated optical transmitter comprises a DFB laser, a phase control section, an electroabsorption (EA) modulator section and an anti-refection coating at the facet. A key difference between the prior art and the present invention is the presence of the phase section between the DFB section and the EA section. Another difference between the prior art and the present invention is that the reflectivity of the facet is chosen to reflect a portion of the modulated light back into the DFB and generate adiabatic chirp. The DFB section is biased at a relatively high, constant bias so as to provide a continuous wave (CW) optical signal at a carrier frequency. The EA section acts as a gate, modulating the output of the DFB section, that replicates the input electrical data line applied to the EA section. The phase section is used to control the magnitude and sign of the adiabatic chirp generated by the DFB. The phase control section located between the DFB and EA sections adjusts the phase of the delayed feedback created in the EA section and fed back into the DFB.

The fabrication of this phase section can be relatively easily implemented by simply splitting the EA section into two sections where one of the sections is either forward or reverse DC biased to change the phase.

The phase control section can also be temperature tuned to change the delay, since it is understood that the refractive index of the semiconductor device changes as a function of temperature. Hence, the phase section can be adjusted by changing the temperature of the device as a whole or just the phase section of the device.

The amount of delay change by application of reverse voltage for Pockels effect, temperature effect, and plasma effect by injection of carriers, are limited to 2% of refractive index for the passive waveguide. This translates into roughly 0.08 ps change in delay time. This delay may be too small compared to the required chirp control simulated in FIG. 4. It may be necessary to resort to some other mechanism to control chirp for a wide range. The following addresses this point.

Important elements of the present disclosure also comprise of the following features in the design of the DFB laser:

(i) the DFB laser has a complex-coupled grating with a λ/4 phase shift in the middle of the cavity to increase the modal gain difference between the main and side modes, and thus improves the stability of single mode operation;

(ii) the length of the extended waveguide outside of the DFB section can be either passive or active, and the length is defined by photolithography or mechanical cleaving of the device; and (iii) the phases of the grating at the ends of grating section are controlled by the EB lithography.

In the following discussion, the importance of these features is explained by simulations.

Figure 3:
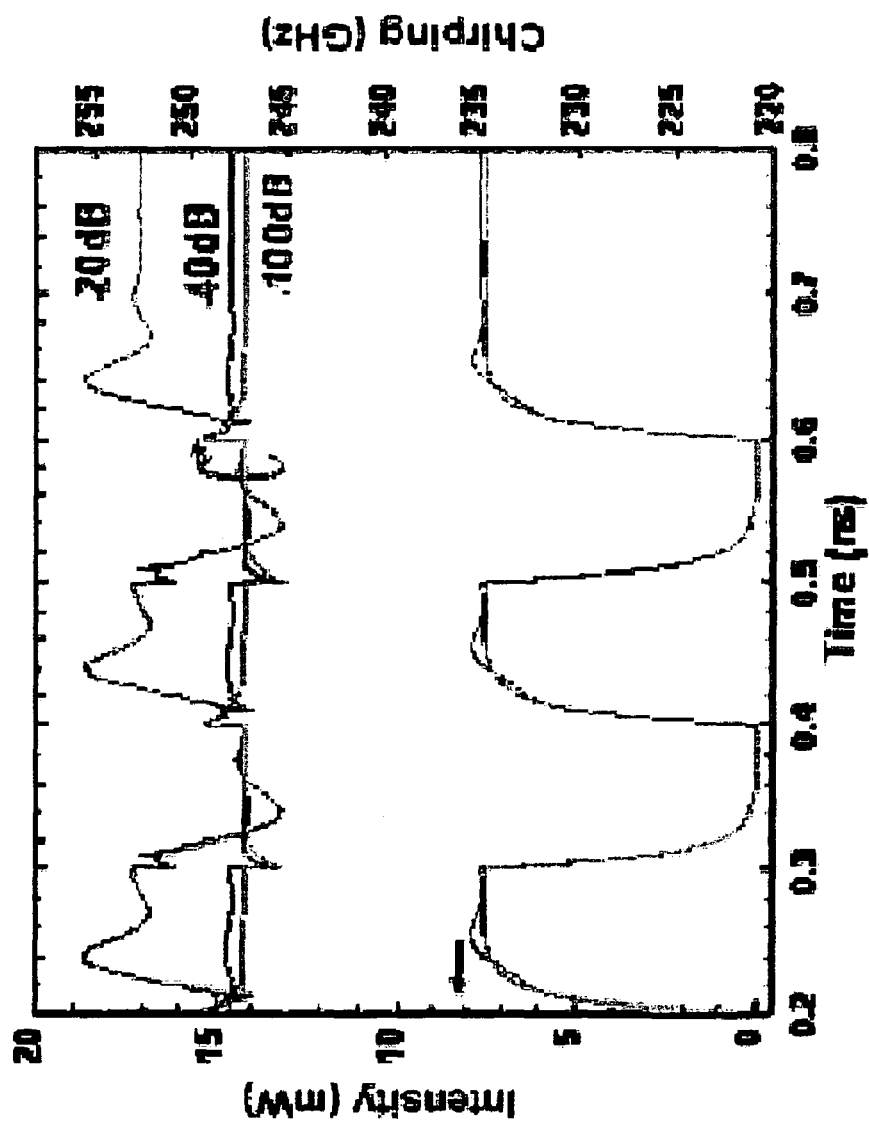
FIG. 3 is a graph illustrating the chirp of a laser in accordance with an embodiment of the present invention for different reflectivities of an end facet of the electroabsorption section.

We have simulated the DFB+EA chirp properties for three different optical reflections (−20 dB, −40 dB and −100 dB) from the end facet of the EA section (see FIG. 3). At a low EA facet reflectivity of −100 dB, only transient chirp at the rise and falling edges can be seen as expected. As the EA facet reflectivity increases, modulated feedback light reflected back into the DFB section causes AM and FM modulation, and a clear adiabatic chirp component shows up for an EA facet reflectivity of −20 dB, as shown in FIG. 3. Higher feedback can result in higher adiabatic chirp, however, it is possible that high reflection degrades the stability of single mode operation in the DFB laser. The complex-coupled DFB laser has an advantage of mode stability against optical feedback and therefore is preferred in one embodiment of this invention.

The chirp can be controlled, for either up or down, by varying the time delay of the reflection. This is demonstrated in FIG. 4. The facet reflectivity for the EA section is −20 dB for the simulation shown in FIG. 4.

Figure 4:
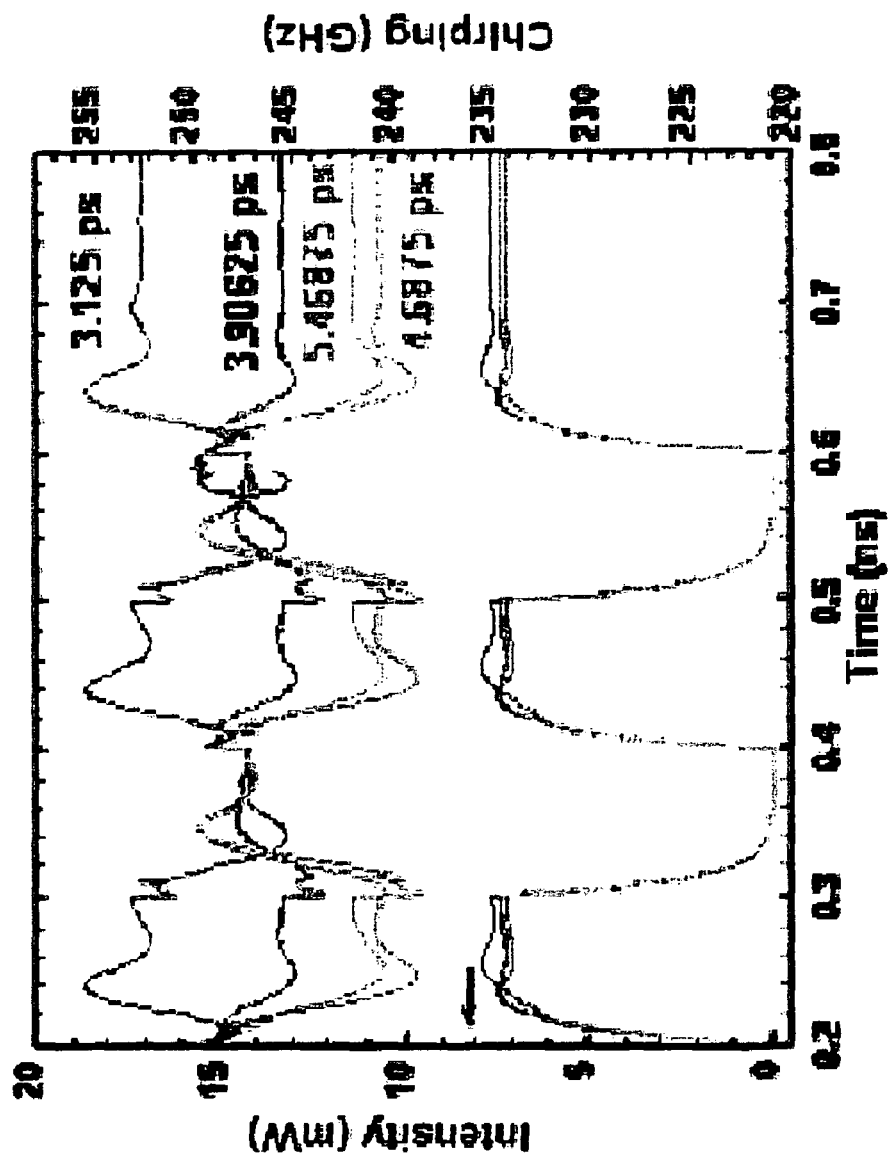
FIG. 4 is a graph illustrating adiabatic chirp of a laser in accordance with an embodiment of the present invention for different delay times from the facet of the electroabsorption section.

In FIG. 4, the delay time for the feedback from the facet of the EA section is varied. The assumed delay times (i.e., the time of flight for the round-trip in the EA section) are 3.125 ps, 3.90625 ps, 4.6875 ps, and 5.46875 ps. The typical delay time for an EA section length of, for example, 200 µm should be about 4.5 ps. As shown in FIG. 4, the chirping can be either up or down, depending on the delay time. The adiabatic chirp can be anything between +/−7 GHz, depending of the phase of the feedback. It can be seen that the sign of the chirp changes as the external cavity length changes from 150 µm to 280 µm. By mechanical cleaving, or by the cavity definition established by photolithography, the cavity length control can be an order of magnitude more precise than that required for controlling the chirp.

Figure 5:
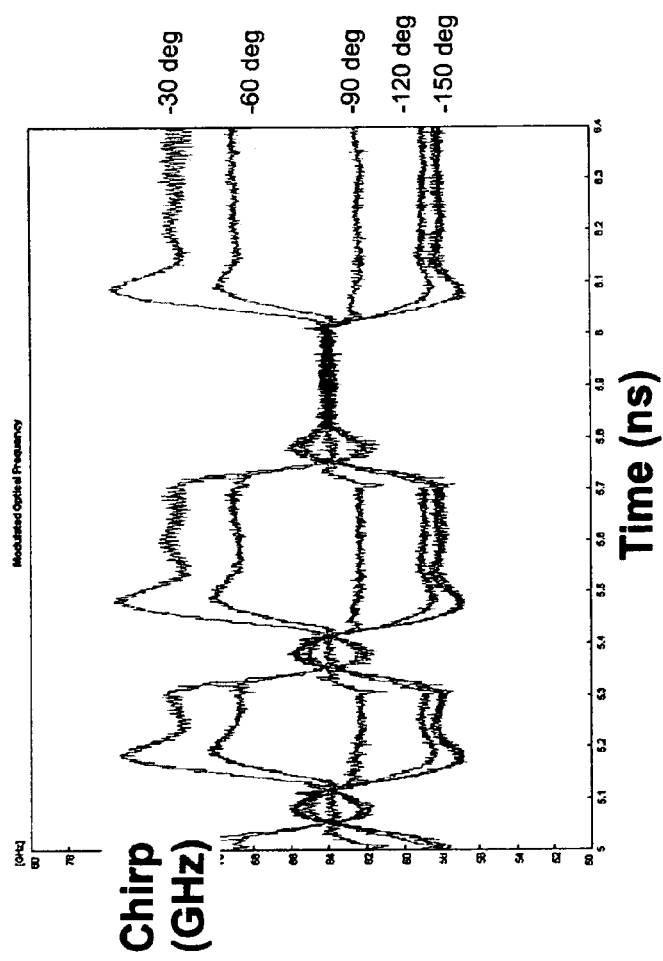
FIG. 5 is a graph illustrating adiabatic chirp of a laser in accordance with an embodiment of the present invention for different grating phases.

FIG. 5 shows the importance of the phase of the grating at the right side of the DFB section facing the EA section. When the grating phase is changed from −150 degrees to −30 degrees, both the magnitude and the sign of the chirp is changed dramatically. In a conventional DFB laser, the phase of the grating at the end of the facet is randomly determined when the grating is uniformly written and the cleave facet determines the end of the grating. By introducing the λ/4 shift in the middle of the cavity and also by adding an extended gain region without grating section, the phase of the grating section at the end of the grating section can be determined by the EB lithography. As shown in FIG. 4, the length of the external section is not a sensitive function for determining the adiabatic chirp. Therefore, it is possible to control the chirp by mechanical cleaving of the extended cavity length, and EB lithography of λ/4-shifted complex-coupled DFB with extended active region on the outsides of the DFB section.

The above example discusses how to control chirp by design and fabrication. Since the grating phase and external cavity length are set during device fabrication and are not adjustable parameters once those are fixed, the precise adjustment of adiabatic chirp cannot be obtained at this point. A method to fine-tune the adiabatic chirp is provided as follows.

In FIG. 2, the λ/4-shift complex-coupled DFB with two electrodes is integrated with the extended cavity section (phase) and the EA section. The precise control of adiabatic chirp is achieved in this case by adjusting the injection current into DFB section 1 (200 µm length) and DFB section 2 (200 µm length).

Figure 6:
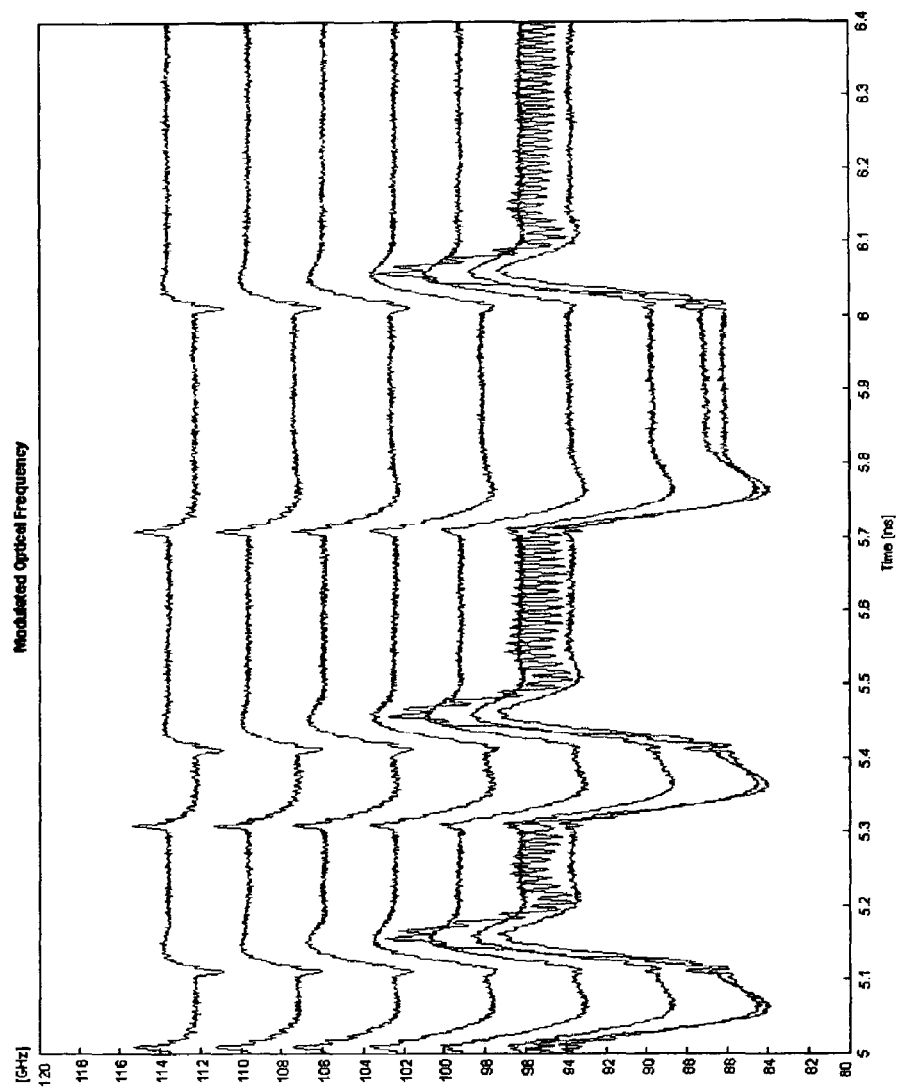
FIG. 6 is a graph illustrating chirp of a laser in accordance with an embodiment of the present invention for different injection currents.

FIG. 6 shows the adiabatic chirp as the injection current into the DFB section 2 is changed. The chirp can be reduced from 8 GHz to 2 GHz as injection current increases from 50 mA to 260 mA. The mode stability is ensured by using the complex-coupled DFB with λ/4 phase shift.

Figure 7:
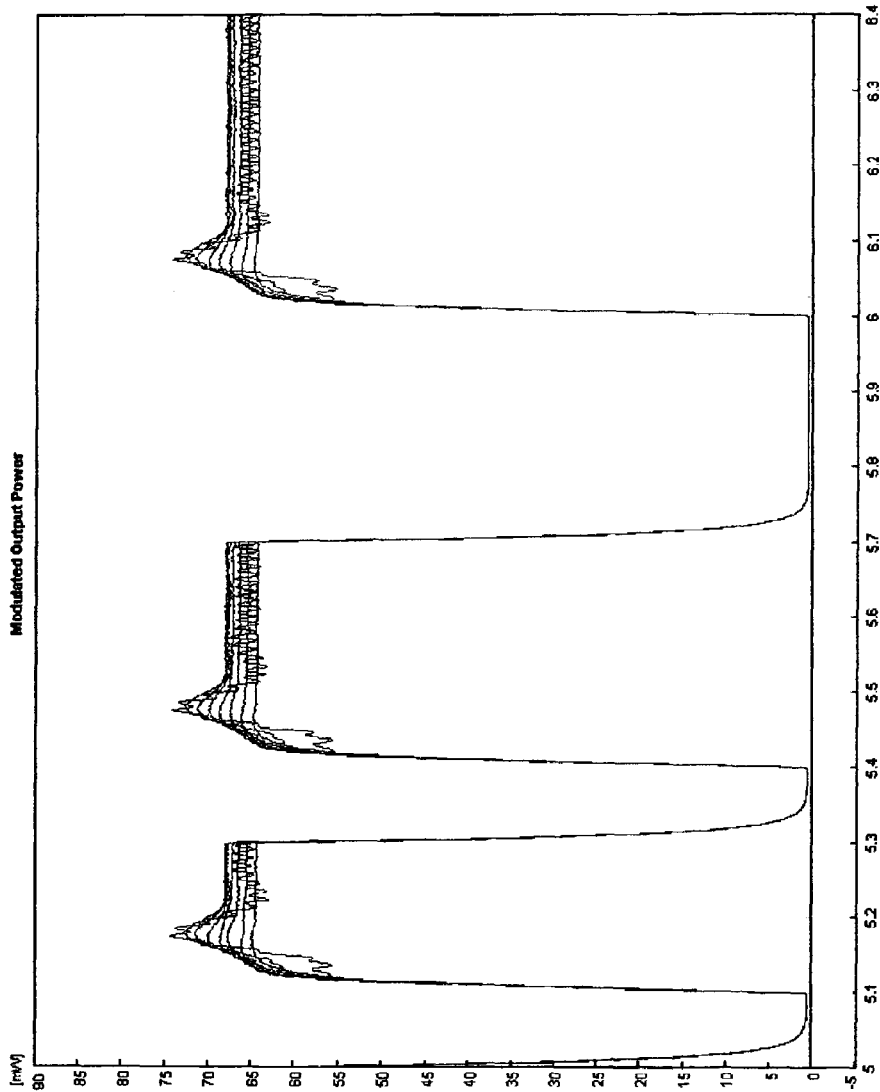
FIG. 7 is a graph illustrating intensity of a laser in accordance with an embodiment of the present invention for different injection currents.

FIG. 7 shows the corresponding intensity modulation waveform. The intensity waveform is not affected much by the injection current into DFB section 2. The amount of chirp can be also controlled by changing injection current uniformly into both of DFB sections. In this case, the output power changes more than the case described here.

One of the advantages of EML (Electroabsorption Modulated Laser) with adiabatic chirp as disclosed herein is small thermal chirp. In conventional DML, the modulation is achieved by modulation in the injection current, and thus the thermal transient is inevitable in the active region. This causes the slow thermal chirp with a time constant of typically ~50 ns to ~5 µs, determined by the geometry of the laser. In this invention, the adiabatic chirp is created by optical feedback to the DFB section, and therefore the thermal transient chirp is minimal as opposed to that for the DML. Furthermore, the sign of the adiabatic chirp is not limited to blue chirp as is the case with DML, but with the present invention both signs for the adiabatic chirp are available. In a conventional DML laser, the thermal chirp is always down-frequency shifted, and the adiabatic chirp is up-frequency shifted. By choosing the proper sign of adiabatic chirp with red-chirped thermal chirp component, the impact of thermal chirp on transmission can be minimized with the technique disclosed in this invention.

Another advantage relates to the delay time in FM and AM modulation. In a conventional DML driven by injection of carrier, the FM modulation always preceeds the AM modulation. This is because gain has to be modulated by injection of carrier to modulate intensity, and therefore frequency modulation is always in advance of intensity modulation. The instantaneous frequency is directly related to the carrier density by plasma effect, and therefore frequency modulation occurs prior to amplitude modulation. This delay between the FM and AM modulation results in non-uniform chirp across the bit in CML, and degrades the transmission performance. In particular, the advance in phase for FM results in the bit having large energy in the trailing edge with different chirp, compared to that at the center of the bit. In the present invention, since the adiabatic chirp is not generated by current modulation, but rather by optical feedback, the FM follows the AM with a minimum delay time between AM and FM. This feature can improve the transmission performance in CML.

Figure 8:
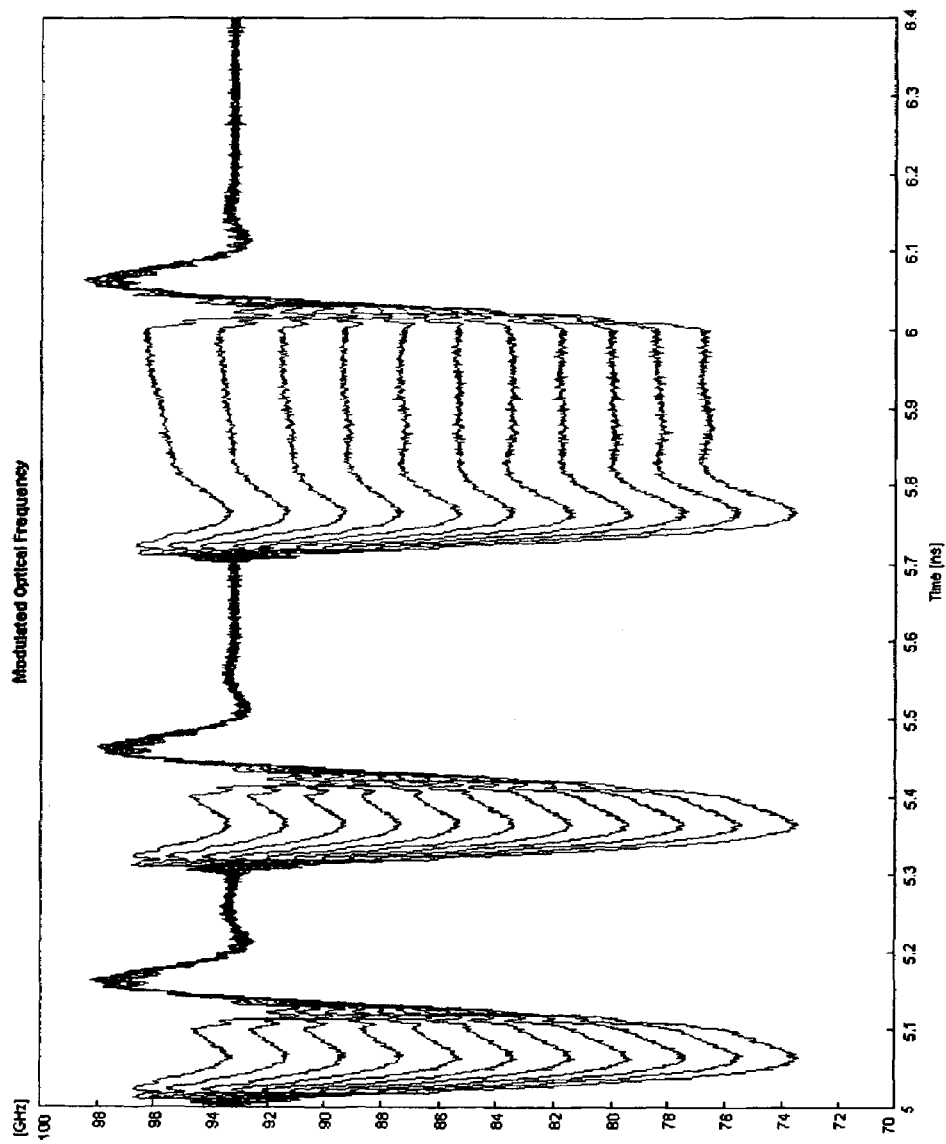
FIG. 8 is a graph illustrating chirp of a laser in accordance with an embodiment of the present invention for different modulation currents.

Additional flexibility in chirp control is provided when modulation is applied to the DFB section together with the EA section. In FIG. 8, DFB 1 and DFB 2 are biased at 150 mA and 70 mA, respectively. The modulation current to DFB 1 is varied from −50 mA (peak-to-peak) to +50 mA (peak-to-peak) with 10 mA (peak-to-peak) step. With −50 mA (peak-to-peak) modulation to DFB 1, the maximum adiabatic chirp can be increased to as large as 18 GHz, which then can be reduced to nearly zero with +50 mA (peak-to-peak) modulation.

The corresponding AM modulation can be seen in the induced relaxation oscillation in the intensity waveform. This oscillation frequency is bias-dependent as usual and, furthermore, the feedback is phase dependent. In general, lasers under self-injection seeding can be sped up or down depending on the phase of the delayed feedback. As for the timing jitter, it is understood that the timing jitter for the injection-seeded laser should be reduced compared to solitary lasers.

It will be appreciated that still further embodiments of the present invention will be apparent to those skilled in the art in view of the present disclosure. It is to be understood that the present invention is by no means limited to the particular constructions herein disclosed and/or shown in the drawings, but also comprises any modifications or equivalents within the scope of the invention.

What is claimed is:

1. A method for generating optical signals comprising:
modulating an optical source to generate digital frequency modulated optical signals, the frequency modulated optical source comprising an integrated multi-section laser comprising a gain section comprising a distributed feedback portion and a non-distributed feedback portion, an electro-absorption section, and a phase section disposed between the non-distributed feedback portion section and the electro-absorption section, wherein the electro-absorption section includes a reflecting element for reflecting light from the electro-absorption section back through the phase section and into the gain section;
selectively adjusting a bias of the phase section, whereby to increase frequency modulation of the optical source.

2. The method of claim 1 wherein the distributed feedback section is a complex coupled quarter wave shifted type in order to produce a single longitudinal mode.

3. The method of claim 1 wherein the length of the electro-absorption section and the length of the phase section are effective to produce desired frequency modulation characteristics.

4. The method of claim 1, wherein modulating the optical source to generate digital frequency modulated optical signals further comprises modulating the electro-absorption section.

5. The method of claim 1, wherein modulating the optical source to generate digital frequency modulated optical signals further comprises directly modulating the distributed feedback section.

6. The method of claim 1, further comprising selectively adjusting a bias of the non-distributed feedback portion, whereby to adjust a magnitude of a frequency excursion of the frequency modulated signal.

7. The method of claim 1, further comprising biasing the non-distributed feedback portion and modulating the distributed feedback portion.

8. The method of claim 1, further comprising adjusting the bias of the phase section an amount effective to change the phase of light through the electro-absorption section to the distributed feedback section effective to induce a predetermined adiabatic chirp in the DFB.

9. The method of claim 1, further comprising supplying modulation current to the distributed feedback section and electro-absorption sections in amounts effective to achieve a predetermined delay between FM and AM modulation.

10. A multi-section laser comprising:
a gain section having a distributed feedback portion having a grating formed thereon and a non-distributed feedback portion, a phase at the end of the grating adjacent the non-distributed feedback portion equal to about −30 degrees;
an electro-absorption section;
a phase section disposed between the distributed feedback gain section and the electro-absorption section; and
an antireflective coating, the electro-absorption section being between the phase section and the antireflective coating, the antireflective coating having a reflectivity about equal or greater than −20 dB.

11. The multi-section laser of claim 10, further comprising first and second electrodes positioned over the distributed feedback portion and non-distributed feedback portion, respectively, the first and second electrodes being separated from one another by an isolation trench.

12. The multi-section laser of claim 10, wherein the distributed feedback portion is a complex coupled quarter wave shifted type.

13. A method for generating an adiabatically chirped signal from electrical digital data, comprising:
biasing a gain section having a distributed feedback gain section having a grating formed thereon and a non-distributed feedback portion, a phase at the end of the grating adjacent the non-distributed feedback portion equal to about −30 degrees;
outputting light from the distributed feedback gain section to an electro-absorption modulator; and
modulating the electro-absorption modulator with the electrical digital data to selectively reflect light back to the distributed feedback gain section to provide an adiabatically chirped modulated output light encoding the electrical digital data.

14. The method of claim 13, further comprising passing light reflected back to the distributed feedback gain section through an adjustable phase section prior to entering the distributed feedback gain section.

15. The method of claim 13, wherein an anti-reflective coating having a reflectivity of about −20 dB or greater is formed on the electro-absorption modulator having the electro-absorption modulator positioned between the anti-reflective coating and the distributed feedback gain section.

16. The method of claim 1, wherein the distributed feedback portion has a grating formed thereon, a phase of the grating adjacent the non-distributed feedback portion being equal to about −30 degrees.

17. The method of claim 1, wherein the distributed feedback portion has a grating formed thereon, a phase of the grating adjacent the non-distributed feedback portion equal to about 150 degrees.

18. The method of claim 1, further comprising applying different bias voltages to the distributed feedback portion and non-distributed feedback portion.

19. The method of claim 18, further comprising a first electrode positioned over the distributed feedback section and a second electrode positioned over the non-distributed feedback section, the first and second electrodes being separated by an isolation trench; wherein applying different bias voltages to the distributed feedback portion and non-distributed feedback portions comprises applying different bias voltages to the first and second electrodes.

* * * * *